(12) United States Patent
Miyahara et al.

(10) Patent No.: US 6,335,055 B1
(45) Date of Patent: Jan. 1, 2002

(54) SQUEEGEE FOR SCREEN PRINTING, SCREEN PRINTING METHOD, AND SCREEN PRINTING APPARATUS

(75) Inventors: Seiichi Miyahara; Takaaki Sakaue; Kimiyuki Yamasaki; Michinori Tomomatsu; Seikou Abe, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/527,228

(22) Filed: Mar. 16, 2000

(30) Foreign Application Priority Data

Mar. 25, 1999 (JP) .................................................. 11-081143

(51) Int. Cl.[7] ....................................................... B05D 3/00
(52) U.S. Cl. ........................... 427/272; 427/277; 427/282; 427/356; 101/129
(58) Field of Search ..................................... 101/120, 123, 101/129; 427/272, 277, 282, 356, 359

(56) References Cited

U.S. PATENT DOCUMENTS

| | | | |
|---|---|---|---|
| 3,796,153 A | | 3/1974 | Jaffa |
| 4,036,129 A | | 7/1977 | Zimmer |
| 5,027,703 A | * | 7/1991 | Hancy ............................ 101/123 |
| 5,685,221 A | * | 11/1997 | Newman ........................ 101/123 |
| 5,775,219 A | | 7/1998 | Shimazu et al. |
| 5,826,516 A | * | 10/1998 | Shimazu et al. ............. 101/483 |
| 5,988,856 A | * | 11/1999 | Braunstein et al. ..... 364/474.02 |

FOREIGN PATENT DOCUMENTS

GB  713583  8/1954

* cited by examiner

Primary Examiner—Brian K. Talbot
(74) Attorney, Agent, or Firm—McDermott, Will & Emery

(57) ABSTRACT

Pattern holes are completely filled with paste. As a result, occurrence of defects is prevented, and an excellent printing performance is obtained, high speed screen printing is possible, and the printing efficiency is enhanced. By sliding in the running direction above the mask plate having pattern holes, this squeegee for screen print can print the paste supplied on the mask plate to the substrate through the mask plate. It includes a contacting portion for contacting with the surface of the mask plate, a filling portion disposed at the running direction side of the contacting portion, and an agitating portion disposed at the running direction side of the filling portion. The agitating portion has a function of rotating the paste by sliding. The filling portion has a function of filling the pattern holes with the paste along with the sliding motion. The paste applied in the pattern holes can be printed on the substrate.

11 Claims, 3 Drawing Sheets

(a)

(b)

(c)

SQUEEGEE FOR SCREEN PRINTING, SCREEN PRINTING METHOD, AND SCREEN PRINTING APPARATUS

TECHNICAL FIELD OF THE INVENTION

The present invention relates to a squeegee for screen printing for printing paste such as cream solder or conductive paste on a substrate, a screen printing method, and a screen printing apparatus.

BACKGROUND OF THE INVENTION

In an electronic component mounting process, screen printing is employed as a method of printing paste such as cream solder or conductive paste on a substrate. This method comprises a step of setting a mask plate having pattern holes opened according to the printing positions on a substrate, and a step of printing the paste on the substrate through pattern holes by supplying the paste on the mask plate and sliding a squeegee.

In this screen printing, as the squeegee moves above the mask plate in the horizontal direction, the paste is applied into the pattern holes, and this paste is printed on the substrate which is set underneath the mask plate. Such conventional printing method included a step of scraping and collecting the paste by a plate member inclined in the running direction, and a step of filling the pattern holes with the paste by moving the squeegee and pressing the paste against the mask plate.

To enhance the productivity, meanwhile, it is demanded to shorten the cycle time also in the electronic component mounting process. It, therefore, requires higher printing speed in the screen printing, that is, a higher sliding speed of the squeegee. However, by sliding a conventional squeegee at high speed, some of pattern holes may be left unfilled to cause printing failure.

It is hence an object of the invention to present a squeegee for screen printing and a screen printing method capable of filling the pattern holes favorable with the paste material even in high speed printing process and enhancing the productivity.

SUMMARY OF THE INVENTION

The squeegee of the invention is used in screen printing for printing the paste supplied on the mask plate on the substrate through the mask plate, by sliding above the mask plate having the pattern holes in the running direction. The squeegee comprises a contacting portion for contacting with the surface of the mask plate, a filling portion disposed at the running direction side of the contacting portion, and an agitating portion disposed at the running direction side of the filling portion, in which the agitating portion has a function of rotating the paste by sliding of the squeegee, the filling portion has a function of filling the pattern holes with the paste along with the sliding motion, and the paste applied in the pattern holes can be printed on the substrate.

The screen printing method of the invention for printing paste on a substrate comprises (a) a step of putting the substrate at the lower side of a mask plate having pattern holes, (b) a step of supplying paste on the mask plate, and (c) a step of sliding a squeegee in the running direction while contacting with the mask plate and scraping and collecting the paste, in which the step of sliding the squeegee includes (1) a step of sliding the squeegee for generating a rotary motion on the paste, (2) a step of filling the pattern holes with the rotating paste, and (3) a step of printing the paste applied in the pattern holes on the substrate.

The screen printing apparatus of the invention for printing paste on a substrate comprises a substrate positioning portion for mounting the substrate, a mask plate disposed above the substrate, and a squeegee slidable above the mask plate. The mask plate has pattern holes, the squeegee can slide above the mask plate in the running direction while scraping and collecting the paste supplied on the mask plate, and when the squeegee slides above the mask plate while scraping and collecting the paste, the squeegee has such a shape as to induce an agitating motion in the paste.

In this constitution, if printing at high speed, the pattern holes can be sufficiently filled with the paste material, and an excellent printing pattern is formed, and high speed printing is possible and the productivity is enhanced.

BRIEF DESCRIPTION OF THE DRAWINGS

FIG. 2(*b*) is a magnified sectional view of the squeegee for screen printing in the embodiment of the invention.

REFERENCE NUMERALS

6 Substrate
12 Mask plate
12*a* Pattern hole
15 Squeegee
18 Plate
18*a* Lower end (contacting portion)
19 Shaping member
26A Filling space
26B Agitating space
28A Filling portion
28B Agitating portion

DETAILED DESCRIPTION OF THE INVENTION

The squeegee for screen printing in an embodiment of the invention is a squeegee for screen printing used for printing paste on a substrate through pattern holes in a mask plate, by sliding above the mask plate on which the paste is supplied. The squeegee has a contacting portion for contacting with the surface of the mask plate, a filling portion disposed at the running direction side of the squeegee consecutively to the contacting portion for filling the pattern holes with the paste along with the progress of the squeegee, and an agitating portion disposed at the running direction side of the squeegee of the filling portion for agitating the paste by rotating the paste along with the progress of the squeegee.

The screen printing method in an embodiment of the invention is a screen printing method for printing paste on a substrate through pattern holes of a mask plate, by sliding a squeegee above the mask plate on which the paste is supplied. The squeegee has a contacting portion for contacting with the surface of the mask plate, a filling portion disposed at the running direction side of the squeegee consecutively to the contacting portion, and an agitating portion disposed at the running direction side of the squeegee of the filling portion. The method includes a step of agitating the paste by providing the paste with a motion in rotating direction by the agitating portion, along with progress of the squeegee, and a step of filling the pattern holes with the agitated paste by the filling portion.

In this constitution, if the squeegee is moved at high speed, the pattern holes can be sufficiently filled with the paste, so that the screen printing efficiency may be enhanced.

An exemplary embodiment of the invention is described below while referring to the accompanying drawings.

Figure 1:
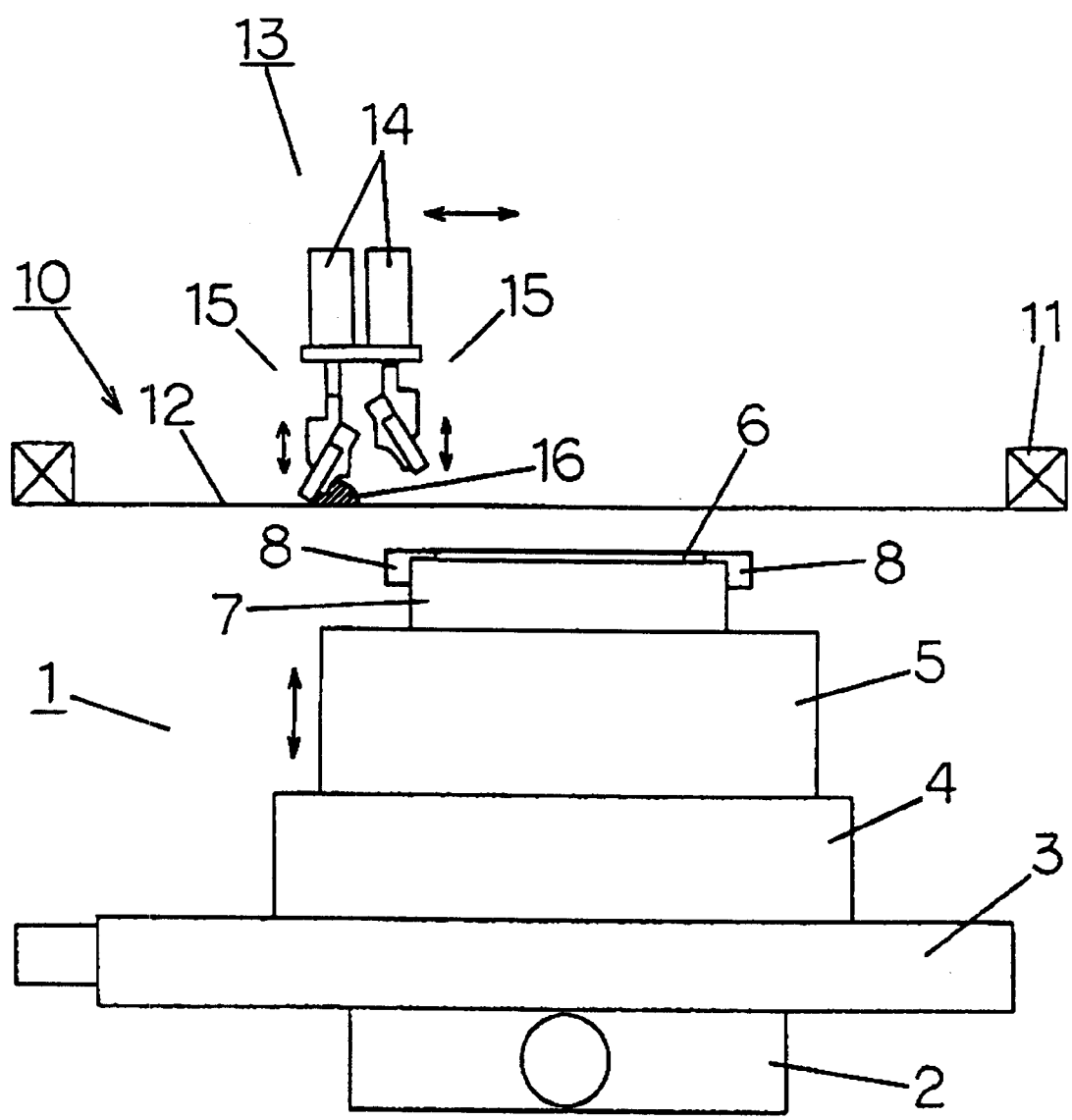
FIG. 1 is a side view of a screen printing apparatus in an embodiment of the invention.
Figure 2:
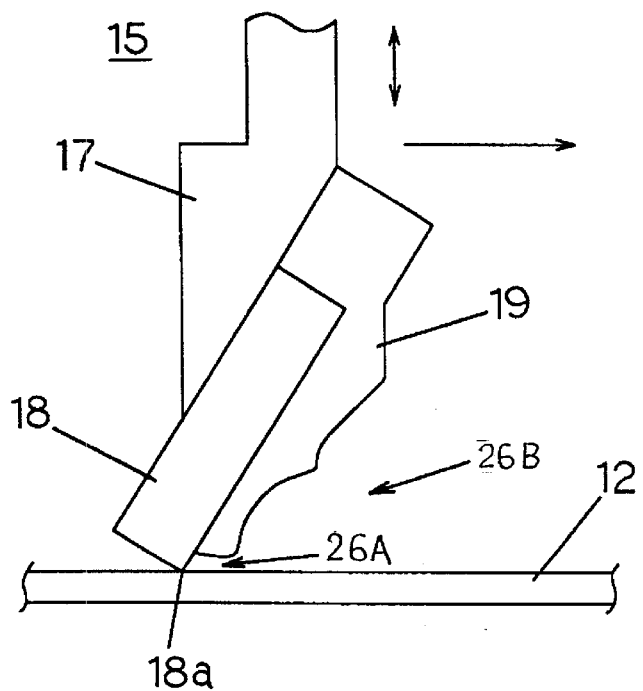
FIG. 2(*a*) is a side sectional view of a squeegee for screen printing in the embodiment of the invention.
Figure 2:
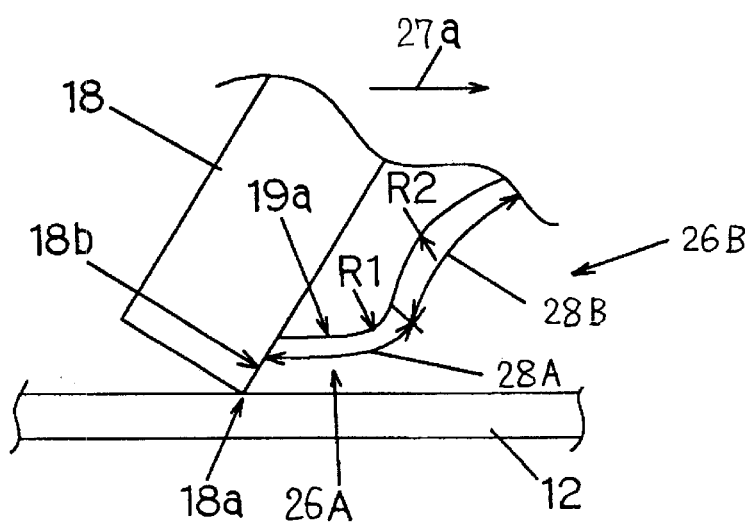

A side view of a screen printing apparatus in an embodiment of the invention is shown in FIG. 1. A side sectional view of a squeegee for screen printing in the embodiment of the invention is shown in FIG. 2(a). A magnified sectional view of the squeegee for screen printing in the embodiment of the invention is shown in FIG. 2(b). Side sectional views depicting steps of screen printing are shown in FIGS. 3(a), (b), and (c).

Referring first to FIG. 1, the structure of the screen printing apparatus is described.

In FIG. 1, the screen printing apparatus comprises a substrate positioning unit 1, a screen mask 10, and a squeegee unit 13. The substrate positioning unit 1 has a horizontal moving table, a Z-axis table 5, and a substrate holder 7. The moving table includes an X-axis table 2, a Y-axis table 3, and a θ-axis table 4, and these tables are stacked up. The Z-axis table 5 is disposed on the moving table, and the substrate holder 7 is disposed on the Z-axis table 5, and has a function of holding the substrate 6 by a clamper 8.

Above the positioning unit 1, the screen mask 10 is disposed. The screen mask 10 has a holder 11 and a mask plate 12. The mask plate 12 is mounted on the holder 11. The mask plate 12 has pattern holes (not shown). The pattern holes are formed at positions corresponding to the printing positions of the substrate 6 to be printed.

Above the screen mask 10, the squeegee unit 13 is disposed. The squeegee unit 13 is moved reciprocally in the horizontal direction above the mask plate 12 by moving means (not shown). The squeegee unit 13 has a pair of squeegees 15, and a cylinder 14. The cylinder 14 moves the squeegees 15 vertically.

Cream solder 16 as the paste is supplied onto the mask plate 12. In this state, by driving the cylinder 14, the lower ends of the squeegees 15 contact with the upper surface of the mask plate 12. By moving the squeegee unit 13 horizontally in this state, the squeegees 15 slide. By sliding of the squeegees 15, the cream solder 16 is scraped and collected on the mask plate 12. As a result, the cream solder 16 is printed on the surface of the substrate 6 through the pattern hole in the mask plate 12.

Referring next to FIG. 2(a), the squeegee 15 is explained.

In FIG. 2(a), the squeegee 15 has a holder 17, a plate 18, and a shaping member 19. The holder 17 is coupled to the rod of the cylinder 14. By driving the cylinder 14, the squeegee 15 moves up and down above the mask plate 12. In the lowered state of the squeegee 15, the lower end 18a of the plate 18 contacts with the surface of the mask plate 12.

The shaping member 19 is placed on the side face at the running direction side of the squeegee 15 of the plate 18. A space is formed between the lower side of the shaping member 19 and the surface of the mask plate 12. In this space, the scraped and collected cream solder is stored. This space includes a filling space 26A and an agitating space 26B.

Referring to FIG. 2(b), the sectional shape of the shaping member 19 for forming the filling space 26A and the agitating space 26B is described.

As shown in FIG. 2(b), the lower end 18a of the plate 18 has a contacting portion for contacting with the surface of the mask plate 12. When the plate 18 advances in the direction of arrow 27a, the lower end 18a of the plate 18 contacts with the mask plate 12, and a filling portion 28A and the filling space 26A are formed in this state. The filling portion 28A and filling space 26A are formed consecutively at the running direction side of the contacting portion 18a.

The filling portion 28A is formed in a range including a lower slope 18b of the plate 18 and a lower end 19a of the shaping member 19. The filling space 26A is a space enclosed by the upper surface of the mask plate 12 in three directions. As the squeegee 15 advances in the direction of arrow 27a, an oblique downward motion at the running direction side is applied to the cream solder 16 in the filling space 26A. As a result, the pattern hole 12a formed in the mask plate 12 is filled with the cream solder 16. The sectional shape of the lower side 19a of the shaping member 19 has a first curved surface R1 as shown in FIG. 2(b) in this exemplary embodiment. By this first curved surface R1, the extra cream solder not applied into the pattern hole 12a is moved upward from the filling space 26A along the shaping member 19.

An agitating portion 28B is formed at the running direction side of the filling portion 28A. The agitating portion 28B has an agitating space 26B formed between the agitating portion 28B and the surface of the mask plate 12. The shape of the side surface of the shaping member 19 at the running direction 27a side has a second curved surface R2 so as to apply motion in rotating direction to the cream solder along with the progress of the squeegee 15. By this second curved surface R2, the cream solder flows in the agitating space 26B, and the rolling performance is improved. The second curved surface R2 has a larger radius of curvature than the first curved surface R1.

Figure 3:
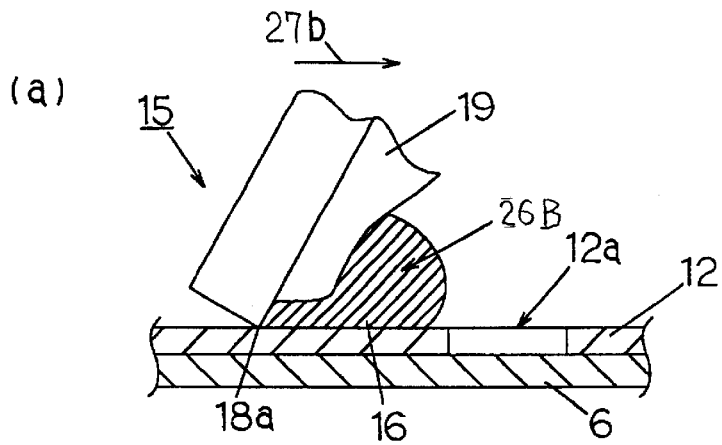
FIG. 3 is a side sectional view showing the screen printing process in the embodiment of the invention.
Figure 3:
Figure 3:
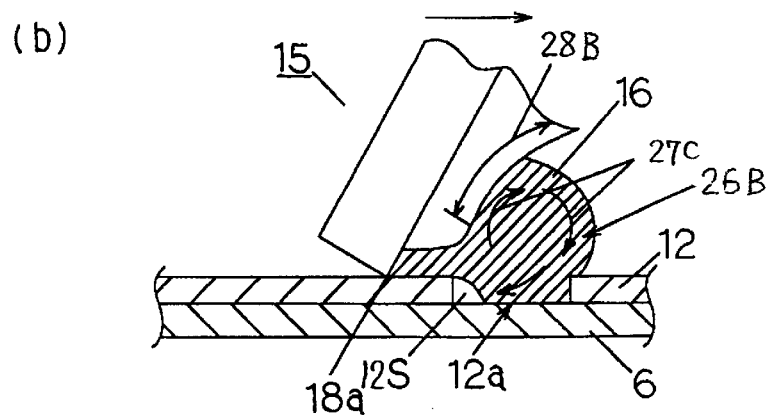
Figure 3:
Figure 3:
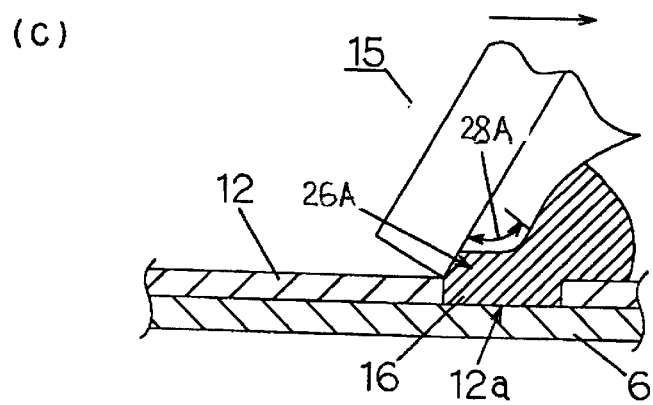

Screen printing by using such squeegees 15 is explained below while referring to FIG. 3.

In FIG. 3(a), the mask plate 12 has a pattern hole 12a. The mask plate 12 is set on the surface of the substrate 6. The cream solder 16 is supplied on the mask plate 12. With the lower end 18a of the squeegee 15 contacting with the mask plate 12, the squeegee 15 is moved in the direction of arrow 27b. As a result, in the space between the shaping member 19 of the squeegee 15 and the mask plate 12, the cream solder 16 is stored. By moving the squeegee 15 successively, the cream solder 16 is scraped and collected in the direction of the pattern hole 12a.

As shown in FIG. 3(b), the cream solder 16 scraped and collected by the move of the squeegees 15 is provided with a rotary motion in the direction of arrow 27c along with progress of the squeegees 15. That is, by the agitating portion 28B, the cream solder 16 in the agitating space 26B is provided with a motion in rotating direction. The scraped and collected cream solder 16 flows in the vertical direction, and the rolling performance of the cream solder 16 is improved. Consequently, the scraped and collected cream solder 16 reaches the position of the pattern hole 12a, and the cream solder 16 begins to get into the pattern hole 12a. At this time, at the left end of the pattern hole 12a (the rear side of the running direction 27b of the squeegees 15), a gap 12S not filled with the cream solder 16 is likely to form. However, as the squeegees 15 move further, the gap 12S is completely filled with the cream solder 16.

That is, as shown in FIG. 3(c), when the squeegees 15 move further and the filling space 26A passes the pattern hole 12a, the cream solder 16 in the filling space 26A is pushed and moved into the pattern hole 12a by the filling portion 28A. As a result, the gap 12S is completely filled with the cream solder 16.

It thus prevents printing failure due to insufficient filling of the pattern hole 12a. The cream solder is printed favorably. Since the squeegees 15 have such shape, the printing cycle time is shortened. When the squeegees 15 are moved faster than in the prior art, defective filling of the pattern hole 12 is prevented. As a result, stable and high-speed screen printing is achieved.

In this constitution, along with the progress of the squeegee, the paste is provided with motion in rotating direction by the agitating portion, and the paste is agitated. The agitated paste is applied into the pattern hole by the filling portion. Therefore, when the squeegee is moved at high speed, the pattern hole is completely filled with the paste. As a result, occurrence of defect is prevented, and an excellent printing performance is obtained, and high speed printing is realized, and the printing efficiency is enhanced.

What is claimed is:

1. A screen printing method for printing a paste on a substrate comprising the steps of:
   (a) putting said substrate at a lower side of a mask plate having a pattern hole,
   (b) supplying paste on said mask plate, and
   (c) sliding a squeegee to a running direction side while contacting with said mask plate, and scraping and collecting said paste,
   wherein said step of sliding the squeegee includes the steps of
      (1) generating a rotary motion in said paste, while sliding said squeegee,
      (2) filling said pattern hole with said paste which has the rotary motion, and
      (3) printing said paste applied in said pattern hole onto said substrate, and
   wherein said squeegee comprises a filling portion for filling said paste into said pattern hole, said filling portion having a section forming a substantially planar surface extending substantially parallel to an upper surface of said substrate.

2. The screen printing method of claim 1,
   wherein said squeegee comprises
      a contacting portion for contacting with the surface of said mask plate,
      said filling portion disposed at the running direction side of said contacting portion, and
      an agitating portion disposed at the running direction side of said filling portion, and
      wherein said agitating portion has a function of rotating said paste by a sliding motion of said squeegee, and said filling portion has a function of filling said pattern hole with said paste along with the sliding motion of said squeegee.

3. The screen printing method of claim 1, wherein, at said step (c), said squeegee slides above the surface of said mask plate at an angle inclined to said running direction side.

4. The screen printing method of claim 2,
   wherein said filling portion has a lower end of a first curved surface,
   said agitating portion has a concave down slope of a second curved surface, said second curved surface having a larger radius of curvature than said first curved surface,
   a filling space is formed between said filling portion and mask plate,
   an agitating space is formed between said agitating portion and mask plate, and at said step (c),
   said paste is scraped and collected in said filling space and agitating space, and
   said paste scraped and collected in said filling space and agitating space moves above said mask plate, while said paste being rotated from upper to lower direction at the running direction side by a working caused by a shape of said first curved surface and second curved surface.

5. The screen printing method of claim 2,
   wherein said agitating portion has a down slope formed on a lower side, and,
   at said step (c), said paste not applied in said pattern holes is moved in the upward direction along said down slope.

6. The screen printing method of claim 1, wherein said squeegee does not exhibit any rotational movement.

7. A screen printing method for printing a paste on a substrate, said method comprising the steps of:
   (a) supplying said paste on a mask plate having a pattern hole,
   (b) contacting a squeegee to a surface of said mask plate, straightly sliding said squeegee in a direction parallel to said surface of said mask plate, and collecting said paste in a space formed between said squeegee and said mask plate,
   wherein said step of sliding said squeegee comprising the steps of:
      (i) generating a rotary motion in said paste collected in said space, while sliding said squeegee, and
      (ii) filling said pattern hole with said paste exhibiting the rotary motion, and
   wherein said squeegee comprises a filling portion for filling said paste into said pattern hole, said filling portion having a section forming a substantially planar surface extending substantially parallel to an upper surface of said substrate.

8. The screen printing method of claim 7, wherein said squeegee comprises:
   a contacting portion for contacting the surface of said mask plate, and
   an agitating portion for rotating said paste collected in said space, when sliding said squeegee.

9. The screen printing method of claim 8,
   wherein said filling portion is disposed in front of said contacting portion relative to the direction of said sliding movement of said squeegee, and
   said agitating portion is disposed in front of said filling portion relative to the direction of said sliding movement of said squeegee.

10. The screen printing method of claim 9,
   wherein said filling portion has a lower end having a first curved surface,
   said agitating portion having a second curved surface having a concave downward slope, said second curved surface having a larger radius of curvature than said first curved surface,
   said space includes a filling space formed between said filling portion and said mask plate, and an agitating space formed between said agitating portion and said mask plate, and
   wherein at said step (b), said paste is collected in said filling space and said agitating space, and
   said paste collected in said filling space and said agitating space moves above said mask plate, while said paste is being rotated in an upper to lower direction by the shape of said first curved surface and said second curved surface.

11. The screen printing method of claim 7, further comprising the step of:

(c) printing said paste applied in said pattern hole onto a substrate.

* * * * *